United States Patent
Bailleul et al.

(10) Patent No.: US 7,205,869 B2
(45) Date of Patent: Apr. 17, 2007

(54) MAGNETOSTATIC WAVE DEVICE BASED ON THIN METAL FILMS, METHOD FOR MAKING SAME AND APPLICATION TO DEVICES FOR PROCESSING MICROWAVE SIGNALS

(75) Inventors: Mathieu Bailleul, Strasbourg (FR); Claude Fermon, Orsay (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/532,898

(22) PCT Filed: Oct. 27, 2003

(86) PCT No.: PCT/FR03/03180

§ 371 (c)(1),
(2), (4) Date: Aug. 23, 2006

(87) PCT Pub. No.: WO2004/040756

PCT Pub. Date: May 13, 2004

(65) Prior Publication Data

US 2006/0292704 A1    Dec. 28, 2006

(30) Foreign Application Priority Data

Oct. 28, 2002    (FR) .................................. 02 13486

(51) Int. Cl.
*H01P 7/00*    (2006.01)
(52) U.S. Cl. .................................................. 333/219.2
(58) Field of Classification Search ................ 333/219, 333/219.2, 202, 142, 186
See application file for complete search history.

(56) References Cited

U.S. PATENT DOCUMENTS

| | | | |
|---|---|---|---|
| 3,157,865 A | 11/1964 | Bradley | |
| 4,188,594 A | 2/1980 | Bongianni | |
| 4,283,692 A | 8/1981 | Adam | |
| 4,853,660 A | 8/1989 | Schloemann | |
| 6,120,917 A * | 9/2000 | Eda .......................... | 428/846.1 |

FOREIGN PATENT DOCUMENTS

JP    0214901    *    9/1991

* cited by examiner

*Primary Examiner*—Stephen E. Jones
(74) *Attorney, Agent, or Firm*—Weingarten, Schurgin, Gagnebin & Lebovici LLP

(57) ABSTRACT

The integrated magnetostatic wave device comprises a substrate (1), a conductive ferromagnetic thin film (2) of thickness lying in the range about 250 nm to 450 nm and preferably being equal to about 300 nm, said thin film (2) being deposited on said substrate (1), a first transducer antenna (10) for receiving microwave electrical signals disposed parallel to said ferromagnetic thin film (2) in the vicinity thereof in order to create magnetostatic waves or spin waves in said material by inductive coupling, and a second transducer antenna (20) for transmitting microwave electrical signals disposed parallel to said ferromagnetic thin film (2) in the vicinity thereof in order to be inductively coupled thereto and in order to deliver microwave electrical signals on the arrival of a magnetostatic wave in the ferromagnetic thin film (2), said second antenna (20) being situated on the same side of the ferromagnetic thin film (2) as the first antenna (10) so as to be essentially coplanar therewith.

23 Claims, 5 Drawing Sheets

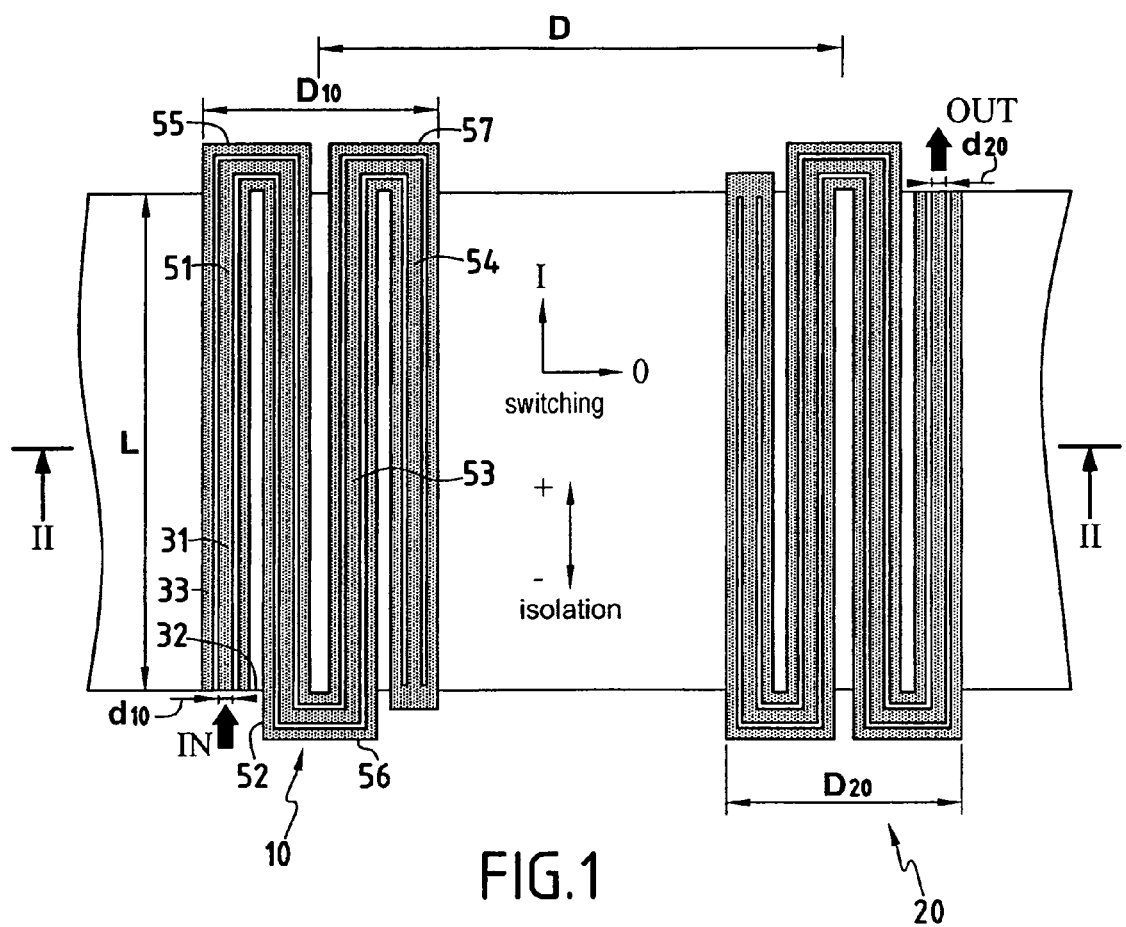
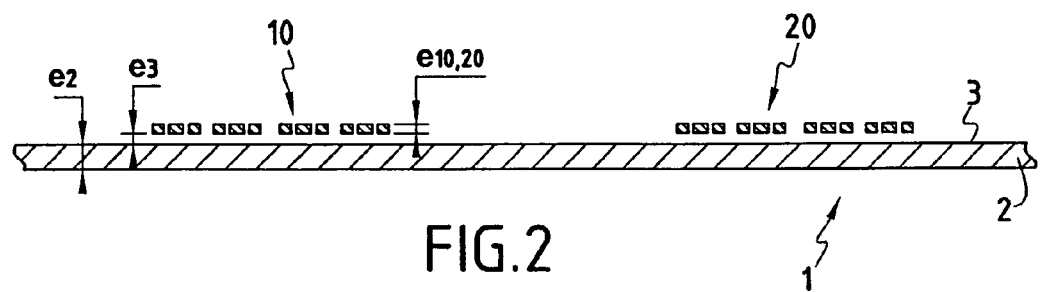
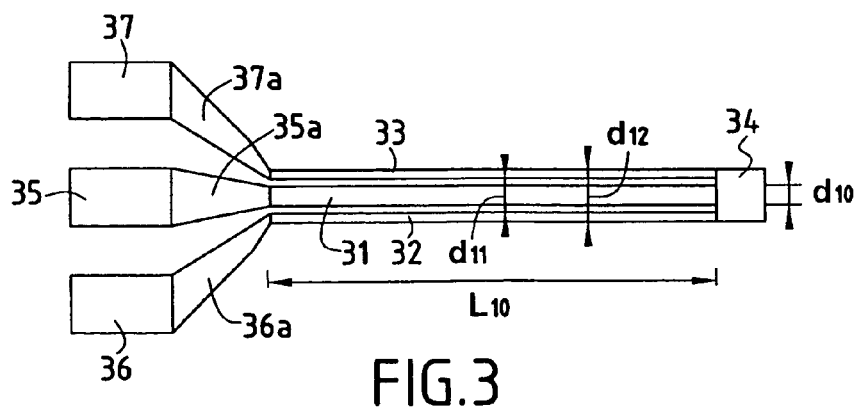

MAGNETOSTATIC WAVE DEVICE BASED ON THIN METAL FILMS, METHOD FOR MAKING SAME AND APPLICATION TO DEVICES FOR PROCESSING MICROWAVE SIGNALS

This application is a 371 national phase filing of PCT/FR2003/003180 filed Oct. 27, 2003, and claims priority to a French application No. 02 13486 filed Oct. 28, 2002.

The present invention relates to magnetostatic wave devices, to a method of fabricating them, and to their applications to devices for processing microwave signals.

Various magnetostatic wave devices are already known that make use of thick layers of a ferrimagnetic insulating material having very low losses, such as a single crystal of yttrium iron garnet $Y_3Fe_5O_{12}$ (YIG) which is itself made by liquid epitaxial growth on a non-magnetic substrate such as a gadolinium gallium garnet $Gd_3Ga_5O_{12}$ (GGG).

Such known magnetostatic wave devices are described, for example, in the document by Waguih S. Ishak entitled "Magnetostatic wave technology: a review", Proceedings of the IEEE, Vol. 76, No. 2, Feb. 1988.

Such YIG devices are not easy to integrate in a semiconductor substrate and they are very difficult and expensive to make in practice. They are thick-layer devices, with thickness of about 5 micrometers ($\mu m$). Since the material has low relaxation, the microwave components they can be used to make have relatively low attenuation of about 20 decibels (dB). In addition, switching is limited to about 1 millisecond (ms) because of their size.

Various magnetostatic wave devices are also known that make use of ferrites, as indicated for example in the article by Martha Pardavi-Morvath, entitled "Microwave application of soft ferrites", published in the Journal of Magnetism and Magnetic Materials 215–216 (2000), pp. 171–183.

Nevertheless, devices of that type are likewise difficult to integrate, presenting layers of ferrimagnetic material having thickness of millimeter order.

U.S. Pat. No. 4,853,660 discloses integratable microwave devices comprising a film of metal ferromagnetic material deposited on a dielectric substrate. Nevertheless, in that document, only one inlet/outlet element is provided constituted by a non-magnetic strip coupled to a ferromagnetic strip. The attenuation of microwaves propagating along the strip is increased considerably when the ferromagnetic material satisfies the condition for ferromagnetic resonance (in this case uniform resonance). Nevertheless, the existence of only one inlet/outlet element greatly limits the applications of such a device.

The present invention seeks to remedy the drawbacks of the above-mentioned devices and to enable magnetostatic wave devices to be made that can easily be integrated on semiconductor substrates using microelectronic fabrication processes and that make it possible to operate at working frequencies that are higher than those of YIG devices.

The invention also seeks to enable various types of functional microwave devices to be fabricated having satisfactory performance while still presenting size and cost that are small.

According to the invention, these objects are achieved by an integrated magnetostatic wave device, characterized in that it comprises a substrate, a conductive ferromagnetic thin film of thickness ($e_2$) lying in the range about 250 nanometers (nm) to 450 nm and preferably being equal to about 300 nm, said thin film being deposited on said substrate, a first transducer antenna for receiving microwave electrical signals disposed parallel to said ferromagnetic thin film in the vicinity thereof in order to create magnetostatic waves or spin waves in said material by inductive coupling, and a second transducer antenna for transmitting microwave electrical signals disposed parallel to said ferromagnetic thin film in the vicinity thereof in order to be inductively coupled thereto and in order to deliver microwave electrical signals on the arrival of a magnetostatic wave in the ferromagnetic thin film, said second antenna being situated on the same side of the ferromagnetic thin film as the first antenna so as to be essentially coplanar therewith.

The ferromagnetic thin film is preferably a magnetic alloy having saturated magnetization greater than or equal to 0.6 T.

The ferromagnetic thin film is advantageously a very soft magnetic alloy such as $Ni_{80}Fe_{20}$.

The ferromagnetic thin film is of width (L) of the order of a few tens of micrometers.

The distance ($e_3$) between the ferromagnetic thin film and either of the first and second transducer antennas is of the order of a few tens to a few hundreds of nanometers.

The spacing distance (D) between the first and second transducer antennas lies in the range about 30 $\mu m$ to about 100 $\mu m$ and is preferably close to 40 $\mu m$.

The first and second transducer antennas may each comprise a central core and two lateral ground conductors parallel to the central core and situated on either side thereof without making contact therewith.

The central core presents a width of the order of a few micrometers.

Each of the first and second transducer antennas extends across the entire width (L) of the ferromagnetic thin film and, in the longitudinal direction of said film, occupies a space of width that is less than said spacing distance (D) and lies in the range about 10 $\mu m$ to about 60 $\mu m$.

In a particular embodiment, at least one of the first and second transducer antennas is of sinuous shape having a succession of branches extending across the width (L) direction of the ferromagnetic thin film.

The frequency of the microwaves lies in the range about 1 GHz to about 100 GHz.

When made in integrated manner, the device of the invention may have a semiconductor substrate.

In a first particular embodiment that enables losses to be measured and magnetic relaxation to be deduced therefrom, the device includes a third transducer antenna disposed parallel to said ferromagnetic thin film in the vicinity thereof so as to be inductively coupled thereto and deliver microwave electrical signals on the arrival of a magnetostatic wave in the ferromagnetic thin film, said third antenna being situated on the same side of the ferromagnetic thin film as the first and second antennas and being interposed in coplanar manner between them.

The device of the invention may be applied to a current-controlled attenuator or switch, and in that case it further comprises first means for applying a transverse magnetic field ($H_A$) in the width (L) direction of the ferromagnetic thin film, second means for applying a longitudinal magnetic field ($H_B$) in the length direction of the ferromagnetic thin film, and control means for controlling at least one of the first and second means for applying a magnetic field in order to modify selectively the characteristics of the resultant magnetic field ($H_R$) acting on the ferromagnetic thin film.

The device of the invention may also be applied to an isolator or to a circulator (in which case at least a third transducer antenna is added). Under such circumstances, the device comprises means for directing the magnetic field applied to the ferromagnetic thin film in such a manner as to obtain non-reciprocity between the first and second transducer antennas, a magnetostatic wave signal being conveyed in significant manner only from the first antenna towards the second antenna. This non-reciprocity may be obtained in particular when the field is applied in the plane of the film, perpendicularly to the wave propagation direction (the magnetostatic surface wave configuration).

The device of the invention may also comprise a thin conductive ferromagnetic film made of a material presenting a plurality of stable states by cubic anisotropy, and such a device may be used to make a current-controlled switch, means being provided for applying magnetic field pulses in order to cause the thin film to switch from one stable state to the other.

The present invention thus makes it possible to make microwave components for telecommunications that are simultaneously suitable for being integrated, of high performance, and of low cost.

By way of example, the invention thus makes it possible to make switches suitable for integration with improved switching performance, with attenuation of the order of 40 dB to 50 dB when the switch is open-circuit (off), and with a switch changeover time of nanosecond order. Such switches can also be used as attenuators, given the extent of the attenuation range.

In this application, the invention makes use of the non-reciprocal nature of the propagation of certain magnetostatic waves. When the magnetic field applied to the ferromagnetic film has a certain orientation, the signal is conveyed from the first antenna towards the second antenna, but in the opposite direction going from the second antenna towards the first antenna, it is attenuated by a factor that may be as great as 20 dB. This makes it possible to implement isolators or circulators of much lower cost than devices of the same type made using YIG technology.

Unlike devices using insulators such as YIG, devices of the invention can be devised so as to benefit from the skin effect due to the metallic nature of the ferromagnetic film and can take advantage thereof by implementing at least two antennas. Beyond skin depth, the thickness of the material behaves like a mirror which channels the surface waves. When they travel along the ferromagnetic film from the second antenna towards the first antenna, the waves are even channeled on the surface opposite from the antennas and therefore do not mix in any way with the waves traveling on the surface facing the antennas.

The metallic nature of the ferromagnetic material leads to very high attenuation, mainly due to electrons. This is disadvantageous when propagation distances are long, however it is not a disadvantage when propagation distances are short. The small size of the device is thus particularly adapted to the high energy losses of the material.

Magnetostatic wave devices of the invention can be placed under conditions of high coupling and high non-reciprocity, and are thus suitable for fabricating devices that are totally integrated, having sides of about 100 µm and insertion losses of a few decibels with selectively of at least 20 dB.

Other characteristics and advantages of the invention appear from the following description of particular embodiments, given as examples and with reference to the accompanying drawings, in which:

FIG. 1 is a diagrammatic plan view showing an embodiment of a magnetostatic wave device of the invention with a conductive ferromagnetic film and two coplanar transducer antennas;

FIG. 2 is a section view on line II—II of FIG. 1;

FIG. 3 is a plan view of an example of an antenna suitable for use in the device of the invention;

Figure 4:
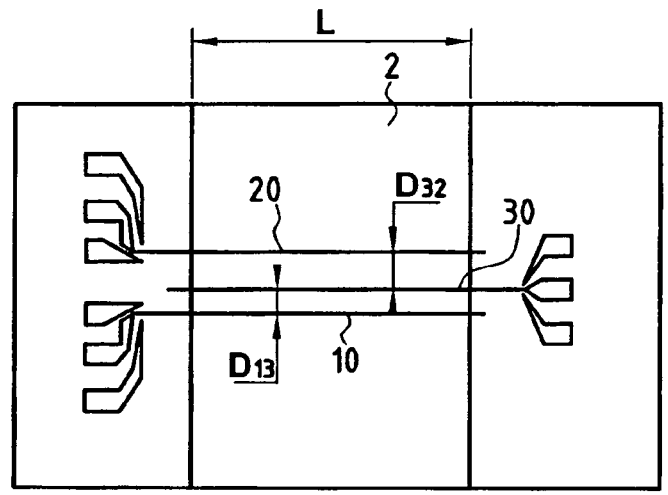
FIG. 4 is a diagrammatic plan view of an example of a magnetostatic wave device having three antennas and serving in particular to evaluate loss and to characterize wave relaxation.

According to an essential characteristic of the present invention, use is made of a thin film 2 of conductive of ferromagnetic material (FIGS. 1 and 2).

Use can advantageously be made of a film made of permalloy $Ni_{80}Fe_{20}$ which is a very soft magnetic alloy having saturated magnetization of about 1 tesla (T). Nevertheless, depending on the application, other metallic ferromagnetic materials could be used, such as for example, epitaxial iron which presents losses that are a little smaller.

More generally, the invention is applicable to all conductive ferromagnetic materials; nevertheless, in practice its operation is satisfactory only when the ferromagnetic material used possesses saturated magnetization greater than or equal to 0.6 T. It is advantageous to use materials having saturated magnetization that is as high as possible. Operating tests have been performed in particular with pure iron at 2.2 T and pure cobalt at 1.7 T. Alloys of those metals are well adapted to the invention.

For metal materials, damping turns out always to be greater than in YIG, and this is generally attributed to the mobile nature of the electrons.

Thus, in a metal sample, high frequency electromagnetic fields are shielded by conduction electrons over a distance equal to the skin depth. The corresponding resonant mode is of evanescent nature in the direction normal to the layer and it is described by a wave vector $k_{eddy}$ having a non-zero imaginary component. Eddy currents can also contribute to damping a wave propagating along the surface of the sample, with the influence of eddy currents being particularly great when the thickness of the film, the wavelength of the magnetostatic wave, and the depth of the skin are all of the same order of magnitude.

It should also be observed that on a more microscopic scale, the mobile nature of the electrons leads to electron-magnon diffusion processes by spin waves that do not exist in insulators and that increase relaxation.

The use of permalloy as a ferromagnetic thin film presents advantages of interest. This material is an alloy of nickel and iron that present non-zero and opposite magnetostrictions. For a mixture containing about 20% iron, the magnetostrictive contributions of the two elements compensate each other. A similar phenomenon also occurs for magnetocrystalline anisotropy. These properties present a considerable practical advantage, since, unless special precautions are taken, fabricated materials are polycrystalline and present neither anisotropy nor magnetostriction (so-called "soft"

materials), such that permalloy has properties that are also ideal even when it is in polycrystalline form.

Thin films of permalloy may be obtained by sputtering deposition techniques and they present properties very close to those of solid permalloy.

A thin film 2 can be deposited on a substrate (FIG. 2) that may be constituted by glass or by silicon, for example. It is entirely suitable for deposition on semiconductor substrates of the kind used in microelectronic fabrication techniques.

As can be seen in FIGS. 1 and 2, a device of the invention comprises two coplanar transducer antennas 10 and 20 situated close to the ferromagnetic thin film 2, and parallel thereto so as to be inductively coupled therewith.

Each antenna 10, 20 is situated at a short distance $e_3$ from the same face of the ferromagnetic film 2.

Each antenna 10, 20 extends transversely relative to the ferromagnetic film 2 over the entire width thereof. Each antenna also presents a length that is not less the width L of the film 2. The transmit antenna 20 delivers microwave electric signals when a magnetostatic wave arrives in the film 2.

The microwaves applied to the antenna 10 and transmitted by the antenna 20 may lie in the frequency range 1 gigahertz (GHz) to 20 GHz, and for example may be about 8 GHz, however they could also lie in a higher frequency range of 20 GHz to 100 GHz.

The antennas 10 and 20 shown in FIGS. 1 and 2, and also in the particular example of FIG. 3, are of the coplanar waveguide type having an interrupted ground plane.

On considering FIG. 3, which shows an antenna having a single transverse branch, it can be seen that making it in coplanar form facilitates fabrication since it does not require any additional lithography steps, as would be required with antennas having a ground conductor situated in a plane different from that of the central core.

The antenna 10 shown in FIG. 3 presents a symmetrical coplanar waveguide configuration with a ground plane 32, 33 situated on either side of the central conductor 32, however such a configuration is not essential. In addition, the dimensions of the ground plane conductors 32, 33 are limited in order to avoid spin waves propagating under a large plane of metal. One end of the antenna is provided with a short circuit 34 while the central core 31 and the lateral ground plane conductors 32 and 33 are extended at the other end by broader tracks 35a, 36a, 37a connecting them to connection tabs 35, 36, and 37.

The width L of the ferromagnetic thin film may lie in the range a few tens to a few hundreds of micrometers. Typically, the width L can thus be equal to 100 µm.

The coupling distance $e_3$ between the transducer antennas 10, 20 and the thin film 2 may be of the order of a few tens of nanometers to a few hundreds of nanometers, and is typically equal to 100 nm.

The thicknesses $e_{10,20}$ of the elements making up the antennas 10, 20 may be of the order of 500 nm, for example.

The width $d_{10}$ of the central core 31 of the antennas 10, 20 may be of the order of a few micrometers, e.g. 3.5 µm or 4 µm.

The width of the lateral ground conductors 32, 33 is not critical. By way of example, the distance $d_{11}$ between the inside faces of the ground conductors 32, 33 may be about 8.5 µm, while the distance $d_{12}$ between the outside faces of the ground conductors 32, 30 may be of the order of 12.5 µm.

Each antenna 10, 20 may extend over a length $L_{10}$ that is slightly greater than the width L of the film 2.

The spacing distance D (FIG. 1) between the antennas 10 and 20 lies in the range 30 µm to 100 µm, and is preferably close to 40 µm.

In the longitudinal direction of the film, each antenna 10, 20 occupies a space of width that is less than the spacing distance D and that preferably lies in the range 10 µm to 60 µm.

As shown in FIGS. 1 and 2, each antenna 10, 20 may be of a shape that is more complex than that of the antenna shown in FIG. 3, and can thus be of sinuous shape having a succession of parallel branches 51, 52, 53, 54 extending in the width direction L of the film 2 and united by short link portions 55, 56, 57 in alternating positions on opposite sides of the film 2. This makes it possible to increase the total length of each antenna, and by virtue of its periodic nature to increase its selectivity while limiting the number of wave vectors over which the injected energy is distributed, so that the efficiency of the antenna as a transducer can be improved.

In the example of FIGS. 1 and 2, the spacing D between the antennas 10 and 20 may be about 75 µm, for example, and the width $D_{10}$, $D_{20}$ of each antenna 10, 20 of sinuous shape in the longitudinal direction of the film 2 may be of the order of 50 µm, for example.

Folding the antennas 10 and 20 into a plurality of branches making up a sinuous shape has the effect of narrowing the passband around resonance.

In the type of antenna shown in FIGS. 1 to 3, the width of the two ground conductors 32, 33 is considerably narrowed and the grounds of the two antennas, which grounds are disjoint, are connected to the general ground of the circuit only at points that are electrically very far apart in order to achieve better control over spin wave dispersion.

Various indications are given below concerning the design of a magnetostatic wave device having two coplanar antennas 10, 20 of the kind shown in FIGS. 1 and 2.

The initial variable is the microwave working frequency. The first design step lies in determining the pitch of the antennas (which are necessarily tuned to the same frequency, but which could be made using different technologies). Between a "go" strand extending across the axis of the film and the "return" strand, there exists a distance p along the axis of the film that constitutes the pitch of the antenna. This pitch p must be equal to $2\pi$ divided by the modulus Q of the wave vector representing the amplitude of the oscillations that it is desired to set up in the magnetic material. Prior to design proper, measurements are performed of the variations in resonant frequency $f_0$ as a function of the wave mode and of the amplitude Q of the wave vector, with the value H of the bias magnetic field being a parameter. For each value of the magnetic wave, there are a plurality of curves, each corresponding to one particular wave mode. Starting from frequency, a modulus Q is thus selected for the wave vector that enables magnetostatic waves to propagate in the film in a manner that is judged to be acceptable. The pitch of the antenna can then be deduced using the above relationship.

In practice, it can be preferable to use another curve that is equivalent, representing variations in the resonant frequency $f_0$ as a function of the value H of the bias magnetic field, with the amplitude Q of the wave vector being a parameter. This produces a plurality of curves corresponding to a plurality of wave modes. Starting from frequency, a wave mode is selected that makes it possible to operate with the antenna pitch and the magnetic field that are judged to be acceptable.

The second design step consists in determining the distance D between the two antennas. As the distance D increases, the amplitude of the transmitted wave decreases exponentially (amplitude being of the form $A_0 e^{-D}$). Furthermore, the amplitude of the parasitic wave conveyed by the wave directly from one antenna to the other is of the form $A_0 D^{-n}$, with this amplitude being significantly reduced (e.g. divided by a factor of the order of 1.5 to 5 or 10) if a ground electrode is placed between the two antennas and connected to electrical ground at a point that is remote from the point where the grounds of the two antennas are connected. Thus, in this second step, a decision is made concerning the level of parasitic transmission through the air that can be tolerated (which amounts to determining an acceptable noise threshold). On the basis of this allowable parasitic transmission level, a horizontal line is plotted on FIG. 9 intersecting a curve A at an operating point of abscissa value giving the distance. For this distance, it is possible to find the value of wave transmission in the film, and if it is too small, the screening between the two antennas can be improved prior to repeating this second step. It is also possible to return to the first step and modify one of the initial magnitudes in the appropriate direction.

Figure 9:
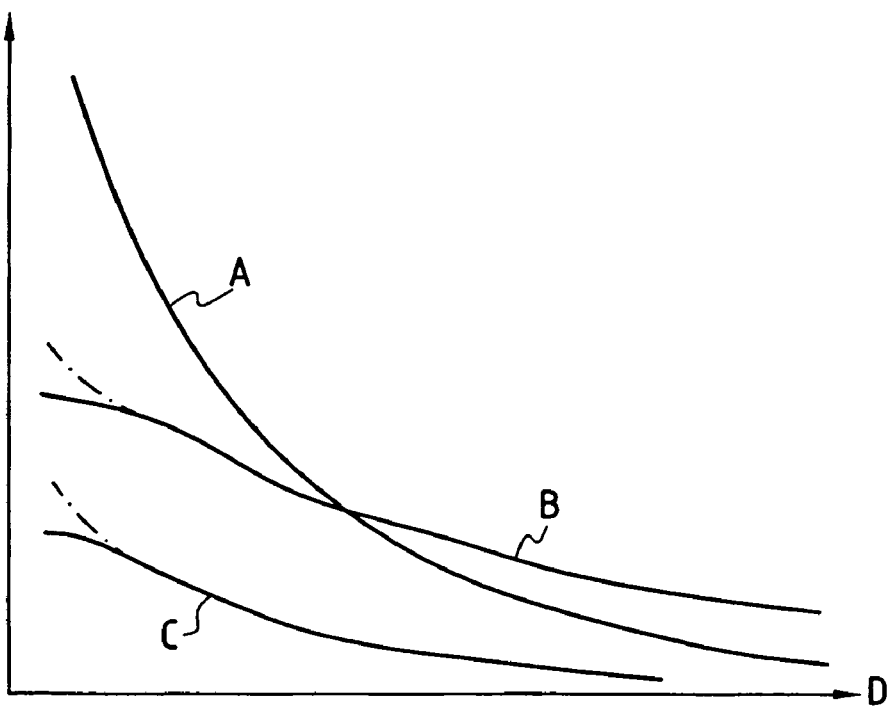
FIG. 9 is a set of curves showing magnetostatic wave transmission as a function of the distance between antennas.

In FIG. 9, three curves A, B, and C represent wave transmission as a function of distance D between the antennas 10 and 20.

Curve A represents transmission in the ferromagnetic film 2.

Curve B represents transmission in air, without any ground electrode being interposed between the antennas 10 and 20.

Curve C represents transmission in air when an additional ground electrode is interposed between the antennas 10 and 20.

The propagation of magnetostatic waves in the thin magnetic metal film 2 depends on the thickness of the film. The properties of the device of the invention depend on the change in the behavior of this film in the vicinity of magnetic resonant frequencies. At the resonance maximum, the magnetic behavior of the film is comparable to the behavior of a "resonant wavetrap" circuit at radio frequencies.

A third design step consists in adjusting the total length of the antennas in such a manner that, at resonance, they have input impedance close to the characteristic impedance of the transmission line used in the intended application (e.g. 50 ohms ($\Omega$)). This precaution ensures that the microwave power injected into the first antenna is fully transferred into the magnetic film and that nothing is reflected. This also makes it possible for the entire power conveyed by the magnetostatic waves to be transferred to the second antenna without any of it being reflected into the film. This also ensures that the resistive losses in the antennas remain low compared with the power transferred to the magnetostatic waves, so as to limit insertion losses.

For the thickness of the ferromagnetic film 2, it may be observed that if the layer is greater than a certain thickness (greater than 1 μm for NiFe/Fe), then eddy currents increase and lead to greater relaxation. A preferred thickness lies in the range 300 nm to 600 nm. As an indication, YIG devices have a thickness of 5 μm, and ferrite devices have a thickness of the order of a few millimeters.

Satisfactory results can be obtained with the film 2 having a thickness $e_2$ lying in the range about 250 nm to 450 nm and preferably equal to about 300 nm, giving a good compromise so as to obtain sufficient coupling with the antennas 10, 20 but without inducing excessive eddy currents in the thickness of the film 2.

FIG. 4 shows a particular embodiment of a magnetostatic wave device of the invention in which a conductive ferromagnetic thin film 2, e.g. made of permalloy, has superposed thereon not only two coplanar transducer antennas 10, 20, e.g. having the same configuration as that shown in FIG. 3, but also a third transducer antenna 30 that is likewise coplanar with the antennas 10 and 20 and that presents a configuration that may be similar thereto, which third antenna is interposed between the antennas 10 and 20. The third antenna 30 extends transversely across the entire width of the film 2, as do the antennas 10 and 20.

By way of example, with a film 2 having a width of 700 μm, the distance $D_{13}$ between the first and third antennas 10 and 30 may be about 50 μm and the distance $D_{32}$ between the third and second antennas 30, 20 may be about 100 μm. These distances are naturally given merely as examples.

The presence of a third microwave antenna 30 in combination with the first and second antennas 10, 20 makes it possible to perform measurements of the real losses within the device and to deduce wave relaxation therefrom, which then makes it possible to adjust the values of certain parameters of the device, such as the distance between the main antennas 10, 20.

For three antennas 10, 20, and 30, one antenna can be used to transmit magnetostatic waves while the other two antennas can be used to receive magnetostatic waves after they have traveled different distances within the film 20. Such a device is therefrom used essentially in the context of developing new microwave devices.

In general, by measuring the signal conveyed between the two antennas 10 and 20 it is possible to observe directly the propagation of a packet of spin waves. It is thus possible to measure the propagation delay ($\Delta t$), and the propagation attenuation (by comparing the amplitude conveyed with the amplitude of the resonance as measured in reflection), and to evaluate field non-reciprocity.

This non-reciprocity property is a feature of surface magnetostatic waves (propagation perpendicular to the applied field, these two vectors being directed in the plane of the film): they are evanescent in the thickness of the film. They are therefore located more particularly on one of the surfaces of the layer (top surface in one direction of propagation, bottom surface in the other direction). By changing the propagation direction (or changing the direction of the applied field which comes to the same), it is possible to change the surface next to which the waves propagate. However, since the transducer antennas 10, 20 are situated above the film 2, they couple better with the top face of the film.

In spite of the high level of relaxation in metal films, devices of the invention make it possible to obtain results that are particularly advantageous when the antennas are made with dimensions that are small enough, and when they are disposed at a spacing that is optimized, as described above.

Below, there follows a description of various examples of applications of the device of the invention to devices for processing microwave signals.

Figure 5:
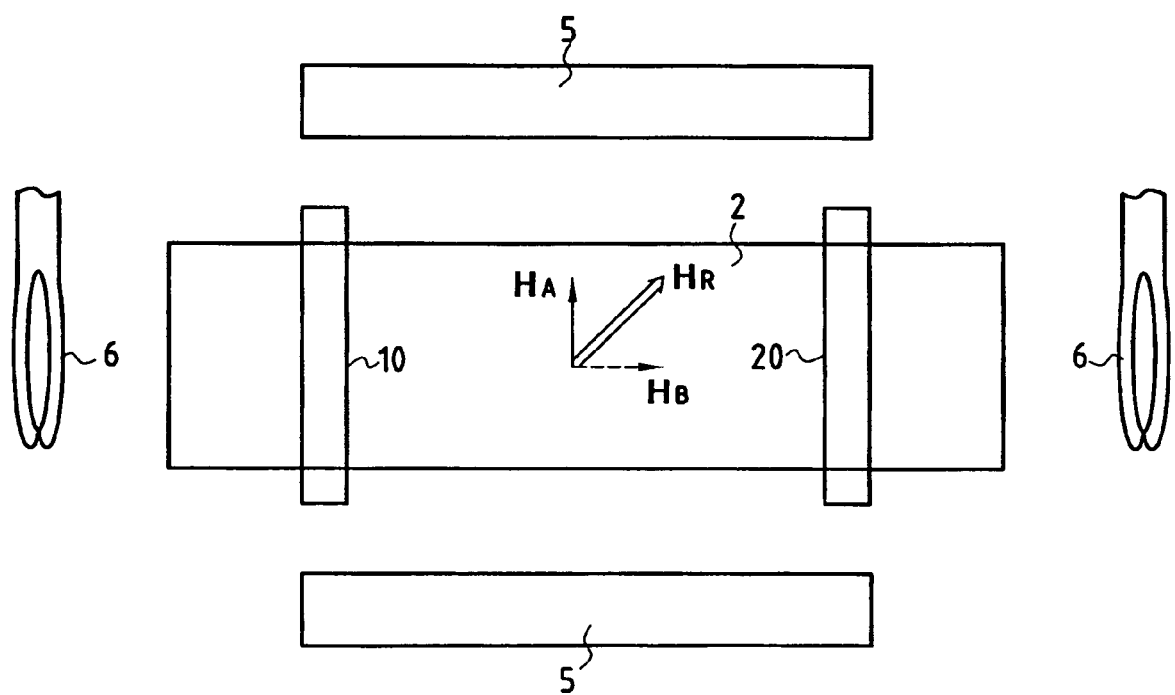
FIG. 5 is a diagrammatic view of an example of an application of the device of the invention to a current-controlled attenuator.

FIG. 5 is a simplified diagram of a current-controlled attenuator. A base device comprising a conductive ferromagnetic thin film 2 and two coplanar transducer antennas 10, 20 as described above is associated with first means 5 such as a pair of permanent magnets or electromagnet coils to apply a transverse magnetic field $H_A$ extending in the width direction L of the film 2. A pair of electromagnet coils 6 are also arranged to apply a longitudinal magnetic field $H_B$ in the length direction of the film 2. Control means are associated with the coils 6, for example, to modify selectively the characteristics of the magnetic field $H_B$ and consequently the characteristics of the resulting magnetic field $H_R$ acting on the film 2. Alternatively, the control means may act on the electromagnet coils of the means 5 for applying the magnetic field $H_A$, or indeed on both sets of control means 5 and 6.

In such an attenuator device, the value of the attenuation is thus determined by the intensity, or preferably by the orientation of the uniform bias magnetic field. As stated above, a simple embodiment may comprise transverse magnetic bias applied permanently and axial bias that is variable and added in order to modify the orientation of the resultant magnetic field.

A switch device can be made in the same manner, where switching occurs by completely interrupting the transmitivity of the device by taking it out of resonance, as happens if the magnetization of the layer is turned through 90°, e.g. by completely interrupting application of the transverse magnetic field by the electromagnet coils 5 and by simultaneously applying the longitudinal magnetic field by the electromagnet coils 6.

A switch device in a variant may have a thin layer of conductive ferromagnetic material 2 with a plurality of stable remanence states (cubic anisotropy) and means for applying a magnetic field pulse to go from one stable state to the other.

The invention is also applicable to passive type devices for processing microwave signals such as isolators or circulators in which, on an incident wave being sent into the system, the system interrupts the reflected wave.

Figure 6:
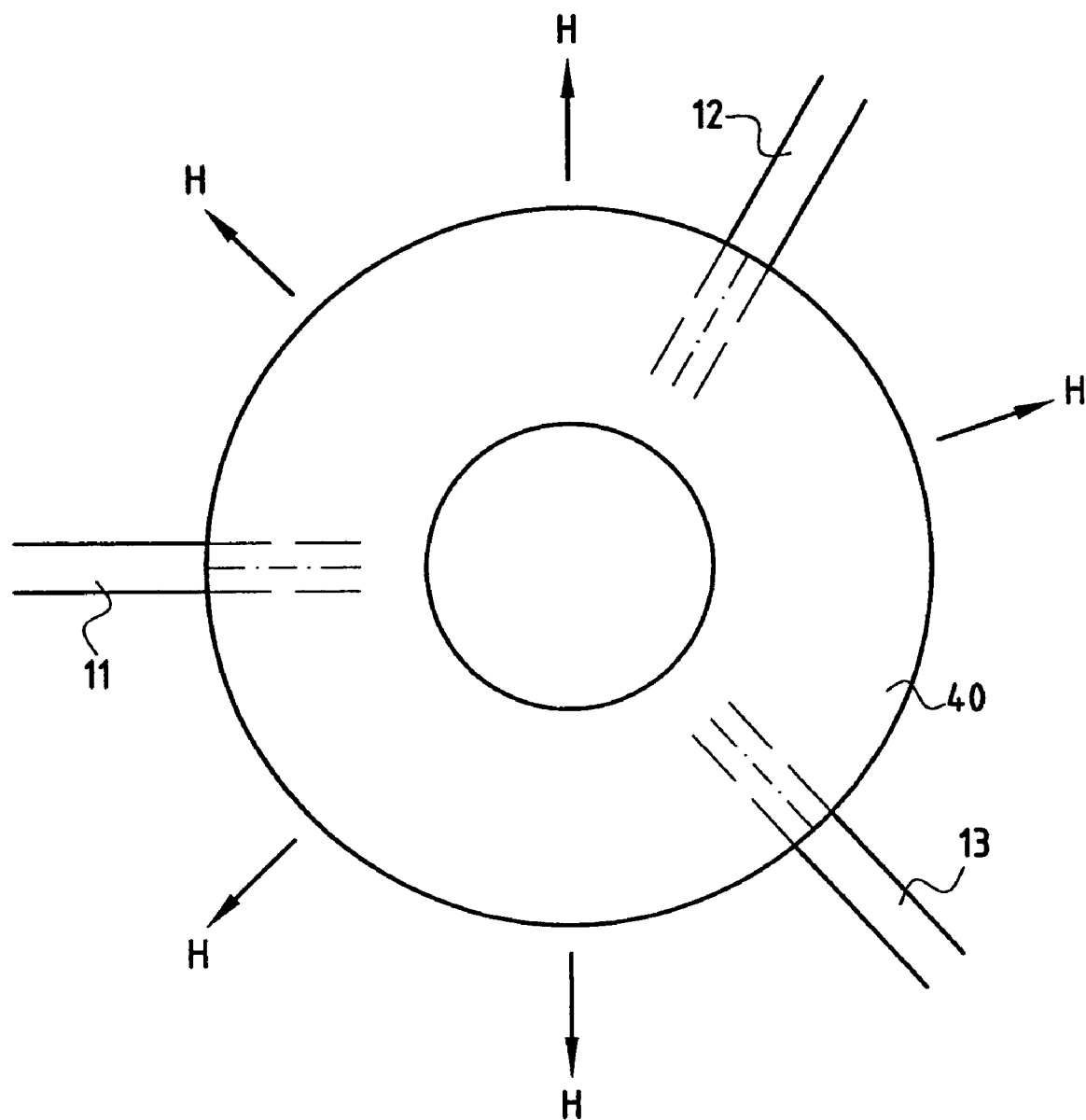
FIG. 6 is a diagrammatic plan view of an example of an application of the device of the invention to a radial magnetic field circulator shown in the plane of the circulator.

FIG. 6 is a diagram of an example of a circulator that can be made in accordance with the invention using a plane conductive ferromagnetic thin film 40 which, instead of being linear, is in the form of a ring. Coplanar transducer antennas 11, 12, and 13, similar to the transducer antennas 10 and 20 are distributed around the ring 40, extending transversely relative thereto.

A radial magnetic field is applied in the plane of the circulator. Efficiency can be of the order of 20 dB or more.

The number of transducer antennas 11, 12, and 13 may be equal to 3 or more, depending on the intended applications.

For a three-antenna circulator (11, 12, 13) of the kind shown in FIG. 6, operation can be the same as when using prior art circulators based on ferrites, i.e. a signal introduced by the antenna 11 is conveyed by the rotary magnetic field towards the antenna 12 but not towards the antenna 13. A signal applied by the antenna 12 is conveyed towards the antenna 13 but not towards the antenna 11, etc.

Because the circulator device of the invention is suitable for being integrated, it can be fabricated at low cost and in miniature form.

Isolators can be made in the same manner as circulators.

Figure 8:
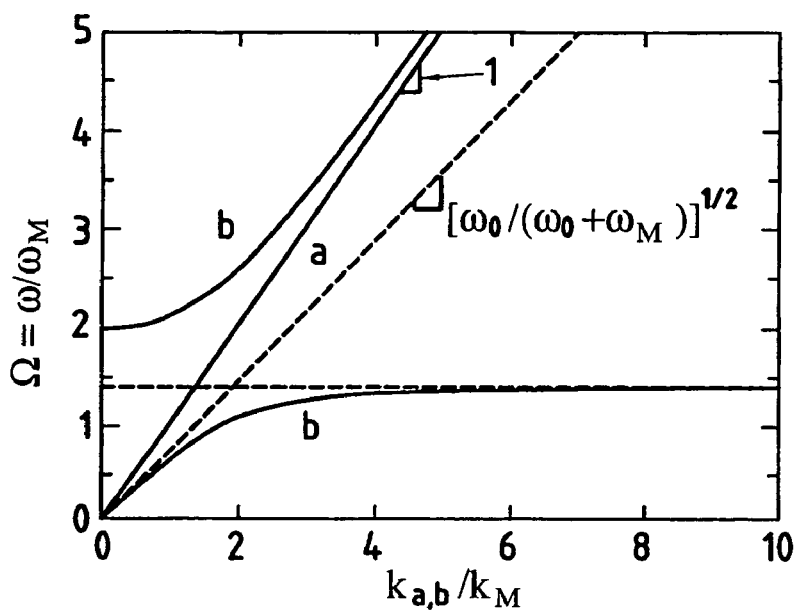
FIG. 8 is a set of curves showing the dispersion of a magnetic material for various propagation modes.

The difference between prior art devices using magnetostatic waves in YIG or in ferrites, and conductive ferromagnetic thin film devices of the invention are described again below with reference to FIG. 8 in which curves a and b give the angular frequency $\Omega$ as a function of the modulus of the magnetostatic wave vector k.

For given frequency, a wave vector is obtained that is much greater when using magnetostatic waves.

This curve gives the dispersion of the material for various propagation modes, i.e. the angular frequency curve corresponding to each magnetostatic wave vector modulus. It can be seen that this curve has three branches. Curve a corresponds to an electromagnetic mode modified by the gyromagnetic properties of the ferromagnetic film (a relationship is obtained in which $\Omega = ck$, as for light waves), and it is this branch which is used for causing ferrite devices to operate (such as Y junction circulators). Curve b has two branches. The upper branch applies to magnetostatic waves. For a zero wave vector, there is a non-zero resonant frequency: this is ferromagnetic resonance, as used in U.S. Pat. No. 4,853,660. For a somewhat greater wave vector, there are propagating magnetostatic modes, as used by YIG devices and in the invention.

In prior art, so-called Y-junction, circulators based on ferrites, the stationary electromagnetic mode imposes a working wavelength $\lambda$ such that $\lambda$ is of the same order of magnitude as the diameter of the magnetic chip. When used without ferrites, this stationary electromagnetic mode imposes a value for $\lambda$ greater than 1 centimeter (cm), and with ferrite, imposes a value for $\lambda$ that varies with the magnetic permeability of the ferrite, but that can be situated around a few millimeters.

In contrast, in a circulator of the invention, the stationary electromagnetic mode imposes a working wavelength $\lambda$ such that $\lambda$ is of the same order of magnitude as the pitch of the antenna. As an indication, this pure magnetic mode imposes a value for $\lambda$ of about 100 μm at a frequency of 3 GHz and with a metallic magnetic film having a thickness of 300 nm.

There follows an example described with reference to FIGS. 7A to 7J of a method of fabrication that enables integrated samples to be fabricated that include magnetic patterns such as the conductive ferromagnetic thin film 2 of FIGS. 1 and 2 and antennas such as the antennas shown in FIGS. 1 to 3.

Figure 7A:
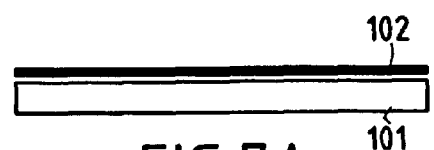
FIGS. 7A to 7J show various steps in an example of the method of fabricating integrated samples of magnetic patterns and antennas suitable for constituting elements of devices of the invention.

FIG. 7A shows a first step in which a layer of $Ni_{80}Fe_{20}$ is deposited by being evaporated onto a glass substrate.

Figure 7B:
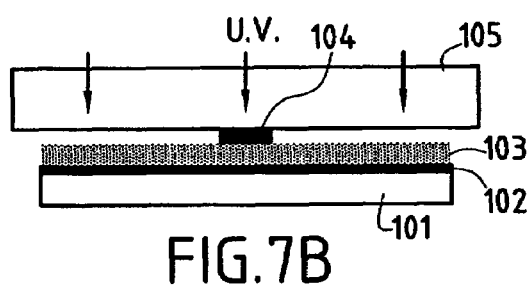

FIG. 7B shows a second step in which the magnetic patterns are written using the positive optical lithography technique. A layer 103 of photoresist is deposited on the layer of $Ni_{80}Fe_{20}$. A mask 104 is deposited on the photoresist layer 103 and the assembly is exposed using an ultraviolet lamp 105 to degrade the photoresist 103 in zones that are not protected by the mask 104. The exposed zones are then dissolved. This leaves photoresist 106 in zones that were initially protected by the metal patterns of the mask 104.

Figure 7C:
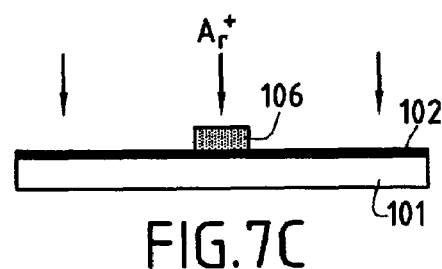

In FIG. 7C, the sample is eroded by ion etching.

Given the ratio of thicknesses between the layers 102 and 104, the remaining photoresist film 106 is still very thick when ion bombardment is stopped, and it needs to be removed chemically.

Figure 7D:
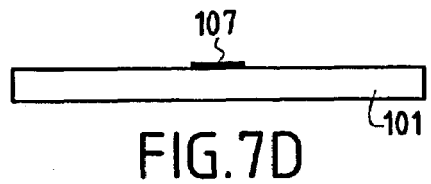

FIG. 7D shows the thin film 107 of $Ni_{80}Fe_{20}$ that remains at the end of the preceding step.

Figure 7E:
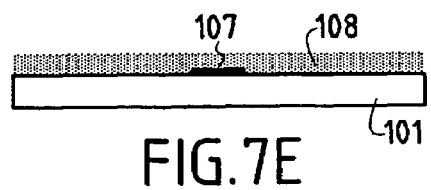

An insulator layer 108 (spacer) such as $Si_3N_4$ or SiO is then deposited so as to provide electrical insulation for the antennas that are subsequently to be deposited on the magnetic patterns (FIG. 7E).

FIGS. 7F to 7J show the various steps of a second optical lithographic process for depositing the antennas.

Figure 7F:
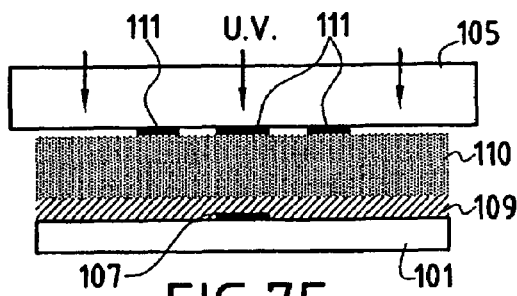

In the step of FIG. 7F, the ultraviolet lamp 105 illuminates a layer of reversible photoresist 110 covered by a mask 111 and previously deposited on the layer of insulation 108.

Figure 7G:
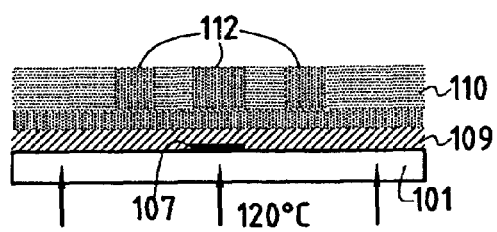

In the step of FIG. 7G, after removing the mask 111, the sample is heated, thus inducing second degradation of the photosensitive agent that has already been transformed by exposure: the resulting molecule inhibits dissolution but is no longer sensitive to light. The entire sample can then be exposed so as to make those zones that were initially protected by the metal patterns of the mask highly soluble.

Figure 7H:
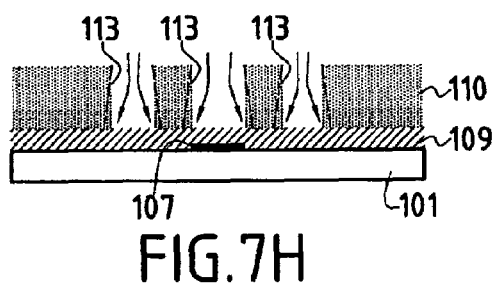

In the step of FIG. 7H, after developing and etching the zones 113 previously protected by the mask 111, a negative image is obtained of the mask.

It should be observed that during the step of FIG. 7F, absorption of light by the photoresist during the first exposure leads to the top portion being exposed to a greater extent. It is thus this zone that is the most insoluble during development in the step of FIG. 7H. The bottom portion of the photoresist 110 can thus be dissolved a little more in order to form a profile with trenches 113 presenting a downwardly-flared shape.

Figure 7I:
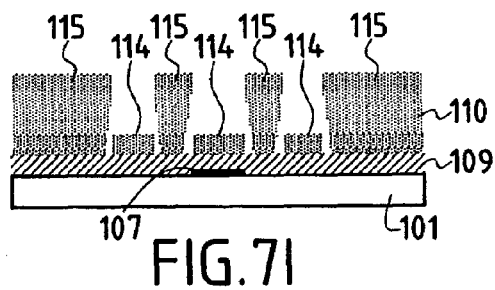
Figure 7J:
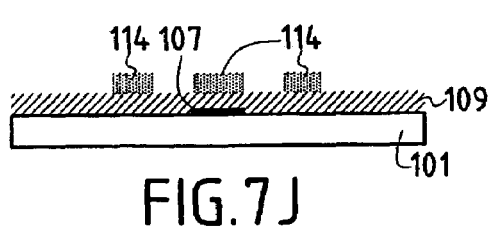

The steps of FIGS. 7I and 7J are steps of a "lift-off" process in which the layer 114, 115 (of silver or copper) that is to form the antennas is initially deposited on top of the entire sample. The sample is then plunged into a solvent so as to dissolve the photoresist 110, thereby conserving metal material 114 only on those zones that were initially revealed by the trenches 113.

It should be observed that when using spacers 108 that are transparent, the masks 111 for the antennas can easily be brought into alignment relative to the magnetic patterns 107.

Other methods of fabricating integrated microwave devices in accordance with the invention enabling thin films of conductive ferromagnetic material to be made in associated with inductively coupled coplanar antennas could naturally be implemented using microelectronic techniques. In particular, the substrate 1 supporting the ferromagnetic layer 2 could be based on silicon.

The invention claimed is:

1. An integrated magnetostatic wave device, characterized in that it comprises a substrate, a conductive ferromagnetic thin film of thickness ($e_2$) lying in the range about 250 nm to 450 nm and preferably being equal to about 300 nm, said thin film being deposited on said substrate, a first transducer antenna for receiving microwave electrical signals disposed parallel to said ferromagnetic thin film in the vicinity thereof in order to create magnetostatic waves or spin waves in said material by inductive coupling, and a second transducer antenna for transmitting microwave electrical signals disposed parallel to said ferromagnetic thin film in the vicinity thereof in order to be inductively coupled thereto and in order to deliver microwave electrical signals on the arrival of a magnetostatic wave in the ferromagnetic thin film, said second antenna being situated on the same side of the ferromagnetic thin film as the first antenna so as to be essentially coplanar therewith.

2. A device according to claim 1, characterized in that it is applied to an isolator or a circulator, and in that it includes means for directing the magnetic field applied to the ferromagnetic thin film in such a manner as to obtain non-reciprocity between the first and second transducer antennas, a magnetostatic wave signal being conveyed in significant manner only from the first antenna towards the second antenna.

3. A device according to claim 1, characterized in that it is applied to a current control switch, in that the conductive ferromagnetic thin film is made of a material presenting cubic anisotropy having a plurality of stable states at resonance, and in that it further comprises means for applying magnetic field pulses in order to cause the thin film to switch from one stable state to the other.

4. A device according to claim 1, characterized in that the ferromagnetic thin film is of width (L) of the order of a few tens of micrometers.

5. A device according to claim 1, characterized in that the distance ($e_3$) between the ferromagnetic thin film and either of the first and second transducer antennas is of the order of a few tens to a few hundreds of nanometers.

6. A device according to claim 1, characterized in that the frequency of the microwaves lies in the range about 1 GHz to about 100 GHz.

7. A device according to claim 1, characterized in that it is made in integrated manner on a semiconductor substrate.

8. A device according to claim 1, characterized in that it includes a third transducer antenna disposed parallel to said ferromagnetic thin film in the vicinity thereof so as to be inductively coupled thereto and deliver microwave electrical signals on the arrival of a magnetostatic wave in the ferromagnetic thin film, said third antenna being situated on the same side of the ferromagnetic thin film as the first and second antennas and being interposed in coplanar manner between them.

9. A device according to claim 1, characterized in that it is applied to a current-controlled attenuator or switch, and in that it further comprises first means for applying a transverse magnetic field ($H_A$) in the width direction (L) of the ferromagnetic thin films, second means for applying a longitudinal magnetic field ($H_B$) in the length direction of the ferromagnetic thin film, and control means for controlling at least one of the first and second means for applying a magnetic field in order to modify selectively the characteristics of the resultant magnetic field ($H_R$) acting on the ferromagnetic thin films.

10. A device according to claim 1, characterized in that at least one of the first and second transducer antennas is of sinuous shape having a succession of branches extending across the width direction (L) of the ferromagnetic thin film.

11. A device according to claim 1, characterized in that each of the first and second transducer antennas is of length shorter than one-fourth of the wavelength of the microwaves.

12. A device according to claim 1, characterized in that the spacing distance (D) between the first and second transducer antennas lies in the range about 30 μm to about 100 μm and is preferably close to 40 μm.

13. A device according to claim 12, characterized in that each of the first and second transducer antennas extends across the entire width (L) of the ferromagnetic thin film and, in the longitudinal direction of said film, occupies a space of width that is less than said spacing distance (D) and lies in the range about 10 μm to about 60 μm.

14. A device according to claim 1, characterized in that the first and second transducer antennas each comprise a central core and two lateral ground conductors parallel to the central core and are situated on either side thereof without making contact therewith.

15. A device according to claim 14, characterized in that the central core presents a width of the order of a few micrometers.

16. A device according to claim 1, characterized in that the ferromagnetic thin film is a magnetic alloy having saturated magnetization greater than or equal to 0.6 T.

17. A device according to claim 16, characterized in that the ferromagnetic thin film is of width (L) of the order of a few tens of micrometers.

18. A device according to claim 17, characterized in that:
the distance ($e_3$) between the ferromagnetic thin film and either of the first and second transducer antennas is of the order of a few tens to a few hundreds of nanometers;
the spacing distance (D) between the first and second transducer antennas lies in the range about 30 μm to about 100 μm and is preferably close to 40 μm;
the first and second transducer antennas each comprise a central core and two lateral ground conductors parallel to the central core and situated on either side thereof without making contact therewith;

each of the first and second transducer antennas extends across the entire width (L) of the ferromagnetic thin film and, in the longitudinal direction of said film, occupies a space of width that is less than said spacing distance (D) and lies in the range about 10 μm to about 60 μm;

at least one of the first and second transducer antennas is of sinuous shape having a succession of branches extending across the width direction (L) of the ferromagnetic thin film;

each of the first and second transducer antennas is of length shorter than one-fourth of the wavelength of the microwaves;

the frequency of the microwaves lies in the range about 1 GHz to about 100 GHz;

it is made in integrated manner on a semiconductor substrate;

it includes a third transducer antenna disposed parallel to said ferromagnetic thin film in the vicinity thereof so as to be inductively coupled thereto and deliver microwave electrical signals on the arrival of a magnetostatic wave in the ferromagnetic thin film, said third antenna being situated on the same side of the ferromagnetic thin film as the first and second antennas and being interposed in coplanar manner between them;

it is applied to a current-controlled attenuator or switch, and in that it further comprises first means for applying a transverse magnetic field ($H_A$) in the width direction (L) of the ferromagnetic thin film, second means for applying a longitudinal magnetic field ($H_B$) in the length direction of the ferromagnetic thin film, and control means for controlling at least one of the first and second means for applying a magnetic field in order to modify selectively the characteristics of the resultant magnetic field ($H_R$) acting on the ferromagnetic thin film.

19. A device according to claim 18, characterized in that it is applied to an isolator or a circulator, and in that it includes means for directing the magnetic field applied to the ferromagnetic thin film in such a manner as to obtain non-reciprocity between the first and second transducer antennas, a magnetostatic wave signal being conveyed in significant manner only from the first antenna towards the second antenna.

20. A device according to claim 1, characterized in that the ferromagnetic thin film is a very soft magnetic alloy such as $Ni_{80}Fe_{20}$.

21. A device according to claim 20, characterized in that the ferromagnetic thin film is of width (L) of the order of a few tens of micrometers.

22. A device according to claim 21, characterized in that:

the distance ($e_3$) between the ferromagnetic thin film and either of the first and second transducer antennas is of the order of a few tens to a few hundreds of nanometers;

the spacing distance (D) between the first and second transducer antennas lies in the range about 30 μm to about 100 μm and is preferably close to 40 μm;

the first and second transducer antennas each comprise a central core and two lateral ground conductors parallel to the central core and situated on either side thereof without making contact therewith;

each of the first and second transducer antennas extends across the entire width (L) of the ferromagnetic thin film and, in the longitudinal direction of said film, occupies a space of width that is less than said spacing distance (D) and lies in the range about 10 μm to about 60 μm;

at least one of the first and second transducer antennas is of sinuous shape having a succession of branches extending across the width direction (L) of the ferromagnetic thin film;

each of the first and second transducer antennas is of length shorter than one-fourth of the wavelength of the microwaves;

the frequency of the microwaves lies in the range about 1 GHz to about 100 GHz;

it is made in integrated manner on a semiconductor substrate;

it includes a third transducer antenna disposed parallel to said ferromagnetic thin film in the vicinity thereof so as to be inductively coupled thereto and deliver microwave electrical signals on the arrival of a magnetostatic wave in the ferromagnetic thin film, said third antenna being situated on the same side of the ferromagnetic thin film as the first and second antennas and being interposed in coplanar manner between them;

it is applied to a current-controlled attenuator or switch, and in that it further comprises first means for applying a transverse magnetic field ($H_A$) in the width direction (L) of the ferromagnetic thin film, second means for applying a longitudinal magnetic field ($H_B$) in the length direction of the ferromagnetic thin film, and control means for controlling at least one of the first and second means for applying a magnetic field in order to modify selectively the characteristics of the resultant magnetic field ($H_R$) acting on the ferromagnetic thin film.

23. A device according to claim 22, characterized in that it is applied to an isolator or a circulator, and in that it includes means for directing the magnetic field applied to the ferromagnetic thin film in such a manner as to obtain non-reciprocity between the first and second transducer antennas, a magnetostatic wave signal being conveyed in significant manner only from the first antenna towards the second antenna.

* * * * *